United States Patent [19]

Kinoshita

[11] 4,173,819

[45] Nov. 13, 1979

[54] METHOD OF MANUFACTURING A DYNAMIC RANDOM ACCESS MEMORY USING MOS FETS

[75] Inventor: Hiroyuki Kinoshita, Tokyo, Japan

[73] Assignee: Tokyo Shibaura Electric Co., Ltd., Kanagawa, Japan

[21] Appl. No.: 931,246

[22] Filed: Aug. 4, 1978

Related U.S. Application Data

[62] Division of Ser. No. 764,897, Feb. 2, 1977, Pat. No. 4,131,906.

[30] Foreign Application Priority Data

Feb. 13, 1976 [JP] Japan .................................. 51/14568

[51] Int. Cl.² ............................................. B01J 17/00
[52] U.S. Cl. .................................. 29/571; 29/577 R; 357/51
[58] Field of Search ................. 29/571, 577, 576 OC; 357/41, 51

[56] References Cited

U.S. PATENT DOCUMENTS

| | | | |
|---|---|---|---|
| 3,570,114 | 3/1971 | Bean | 29/577 |
| 3,771,147 | 11/1973 | Boll | 357/41 |
| 4,012,757 | 3/1977 | Koo | 357/41 |
| 4,125,933 | 11/1978 | Baldwin | 357/51 |

*Primary Examiner*—W. C. Tupman
*Attorney, Agent, or Firm*—Oblon, Fisher, Spivak, McClelland & Maier

[57] ABSTRACT

A dynamic Random Access Memory consisting of pairs of adjacent one transistor/one capacitor memory cells. The gate electrodes of the MOS FETS in each pair of adjacent memory cells are coupled and further connected to an address line at only a single contact hole. There is also disclosed a method for manufacturing the dynamic Random Access Memory with a high integration density. The gap between one electrode of the capacitor and the MOS FET is minimized by converting the end portion of the capacitor electrode to a thin insulating film.

3 Claims, 12 Drawing Figures

METHOD OF MANUFACTURING A DYNAMIC RANDOM ACCESS MEMORY USING MOS FETS

This is a division of application Ser. No. 764,897, filed Feb. 2, 1977, now U.S. Pat. No. 4,131,906.

BACKGROUND OF THE INVENTION

1. Field of the Invention

This invention relates to a RAM (Random Access Memory) using a MOS FET (Metal Oxide Semiconductor Field Effect Transistor) and more particularly to a dynamic RAM consisting of one transistor/one capacitor memory cells.

2. Description of the Prior Art

Generally, when a random access memory (RAM) is formed on a semiconductor substrate, the areas occupied by the individual memory cells take up almost the whole area of the memory chip. In the latest MOS type semiconductor memory devices, in order to increase the memory capacity, what is known as the one transistor/one capacitor cell system has become the main trend and is being widely used. In this system, the area occupied by a single memory cell is small and the structure which consists of one transistor and one capacitor for each bit is simple.

As is well known this one transistor-one capacitor cell consists of a MOS transistor for reading out and writing in information and a capacitor connected in series between the MOS transistor and a power source for storing the information. Furthermore an address line is connected to a gate electrode of the MOS transistor and a digit line is connected to an electrode region of the MOS transistor. In this memory cell the reading out and writing in of information takes place by charging and discharging the capacitor controlling the MOS transistor. Conventionally this memory cell is formed as a semiconductor intregrated circuit as follows. A polycrystalline silicon gate electrode of the MOS transistor is formed bridging two diffused electrode regions, one of which is connected to the impurity diffused data line. An electrode of the capacitor made of polycrystalline silicon is formed adjacent to the MOS transistor on a semiconductor substrate with an insulating layer between this layer and the substrate. When the highest voltage is applied to the electrode of the capacitor, an inversion layer in the semiconductor substrate is formed, which works as both another electrode region of the MOS transistor and another electrode of the capacitor. Thereby a one transistor/one capacitor memory cell is formed. An address line made of aluminum disposed above an insulating layer is connected to the gate electrode at the contact portion.

The above-mentioned memory cell has some drawbacks. First, the MOS transistor is connected to the metal layer, which constitutes the address line, by the gate electrode, and one contact hole is needed per memory cell for electrical connection between this metal layer and the polycrystalline layer which constitutes this gate electrode. Therefore, as the memory capacity is increased, the number of contact holes on the semiconductor substrate also increases, which makes the chip size large. On the other hand, in order to make the integration density higher it is necessary to make the size of the contact holes more and more minute, and in this respect lowering of the manufacturing yield cannot be avoided. Also, a second drawback is that in the manufacture of the memory cell the gate electrode of the above-mentioned MOS transistor and one electrode of the capacitor are made in the same step. Specifically, a polycrystalline silicon layer is formed over the whole surface and then is etched away leaving two polycrystalline silicon electrodes. Accordingly, in order to make sure of separating the gate electrode of the MOS transistor and one electrode of the capacitor, the gap between the polycrystalline silicon layers must be at least about $5\mu$. This is the limiting value in the present state of separation etching by using a mask pattern, and the wasteful presence of such a space between the transistor and the capacitor, in addition to the first drawback, is still more undesirable as regards increasing the degree of integration.

SUMMARY OF THE INVENTION

Accordingly, one object of this invention is to provide a dynamic RAM whose integration density is high.

Another object of this invention is to provide a dynamic RAM which comprises a plurality of memory cells consisting of one transistor and one capacitor, in which the number of contact holes is small.

Yet another object of this invention is to provide a method for manufacturing a dynamic RAM which comprises a plurality of memory cells consisting of one transistor and one capacitor, in which it is possible to make the spacing of an electrode of the capacitor and the gate electrode of MOS transistor very small.

A further object of this invention is to provide a method for manufacturing a dynamic RAM with a high yield.

According to this invention a dynamic Random Access Memory using MOS FETs comprises:

a semiconductor substrate of one conductivity type; a pair of data lines each comprising an impurity diffusion layer of an opposite conductivity type and formed in the semiconductor substrate; a pair of adjacent memory cells located between the data lines, each cell comprising a capacitor and a MOS FET formed adjacent to the capacitor for reading out and writing in information, the capacitor including a first electrode formed by a first conductor located above the semiconductor substrate, and an insulating film between the conductor an the substrate, the MOS FET having two electode regions and a gate electrode, one of the electrode regions being coupled to one of the pair of data lines; a second conductor connecting the gate electrodes of the MOS FETS in the pair of adjacent memory cells and disposed above the first conductor with an insulating film located between the first conductor and the second conductor; an address line formed above the memory cells; and a single contact hole connecting the second conductor to the address line.

Further, according to this invention a method for manufacturing a dynamic Random Access Memory comprises the steps: forming a first thin insulating film on a semiconductor substrate; forming a first conductor having an end portion lying on a portion of the first insulating film to serve as one electrode of a capacitor; converting the end portion of the first conductor to a second thin insulating film; and forming a second conductor to serve as the gate electrode of a MOS FET on a gate insulating layer in the plane of and adjacent to the first conductor with the second thin insulating film separating the second conductor and the first conductor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
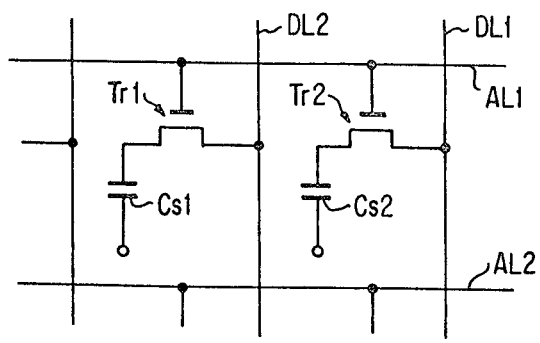
FIG. 1 is a schematic circuit diagram showing a one transistor/one capacitor cell.
Figure 2:
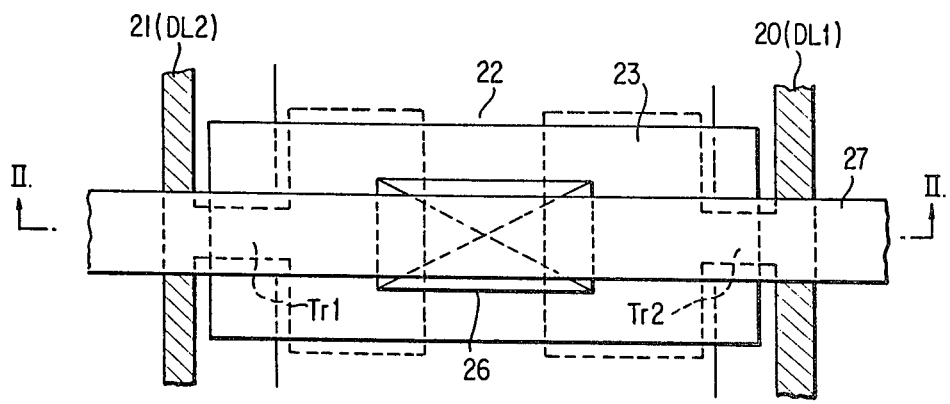
FIG. 2 is a circuit pattern layout showing one embodiment according to this invention.
Figure 3:
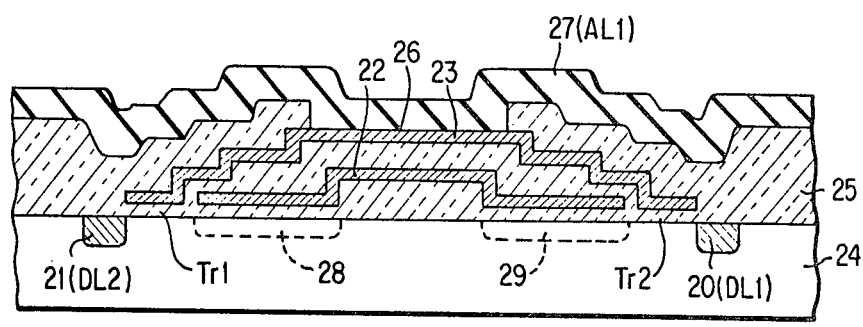
FIG. 3 is a sectional view on line II II of FIG. 2.

Referring now to the drawings, wherein like reference numerals designate identical or corresponding parts throughout the several views and more particularly to FIGS. 1-3 thereof, there will now be described a dynamic RAM according to one embodiment of this invention. In FIG. 2, a plane pattern of memory cells corresponding to the circuit diagram of FIG. 1 is shown as an embodiment of this invention. Diffusion layers 20, 21 of the opposite conductivity type as that of the semiconductor substrate form digit lines DL1, DL2 respectively, and also form respective electrode regions of MOS transistors. First and second conductors 22, 23 such as polysilicon layers are formed on the semiconductor substrate 24 with a silicon oxide film or other insulating film 25 between these layers and the substrate, located one above the other. At the contact hole 26, the second conductor 23 is connected to a metal layer 27 above an insulating layer, which corresponds to an address line AL1. The second conductor 23 corresponds to the gate electrodes of MOS transistors $Tr_1$, $Tr_2$ for writing in and reading out information and the first conductor 22 corresponds to an electrode of capacitors $Cs_1$, $Cs_2$. Now, the regions shown by broken lines in the above-mentioned polycrystalline silicon layers show that the insulating layer directly under these regions is formed more thinly than in other regions, and they constitute respectively the capacitor Cs and the MOS transistor Tr. The first conductor 22 is connected to a maximum voltage T, causing inversion layers 28, 29 to be formed in the substrate surface, so that an electrode of capacitors $Cs_1$, $Cs_2$ and an electrode region of the MOS transistors $Tr_1$, $Tr_2$ are formed simultaneously. In this way, capacitors $Cs_1$, $Cs_2$ having a specified capacity are formed by inversion layers 28, 29, the thin insulating film and the first conductor 22, and thereby a selected memory cell consisting of one MOS transistor and one capacitor is completed. According to this embodiment, the first conductor 22, which constitutes one electrode of the capacitors $Cs_1$, $Cs_2$ and the second conductor 23, which constitutes the gate electrodes of the transistors $Tr_1$, $Tr_2$, are located one above the other, and the gap separating the transistor and the capacitor is close to zero so that the chip size is reduced. On the other hand, two memory cells are formed side by side between data lines DL1 and DL2 formed parallel to one another. A respective one of these cells is connected to each of these lines, and an address line AL1 crossing the data lines DL1 and DL2 and at right angles to the data lines is formed above the two memory cells. By this means, since the gate electrodes of the transistors $Tr_1$, $Tr_2$ of the two memory cells are formed from the second conductor 23, electrical connnection of an address line Al1 to the memory cells can be made by way of a single contact hole 26. Thus, it becomes possible to reduce the number of contact holes to half the number required in the case of the known memory cell.

By the above-mentioned two features of this embodiment, the areas of the memory cells of one transistor and one capacitor system semiconductor memory device can be reduced.

Figure 4A:
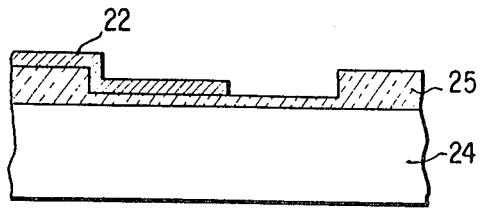
FIGS. 4A to 4F are process views for explaining a method for manufacturing the dynamic RAM shown in FIGS. 2 and 3.
Figure 4B:
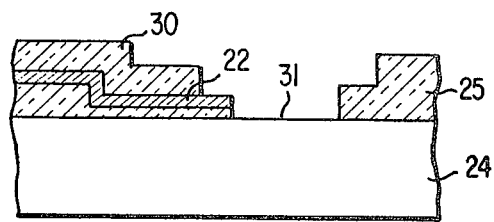
Figure 4C:
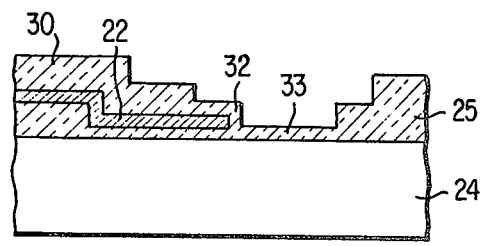

Next, a description of the process of manufacturing the above-mentioned memory cell will be given referring to FIGS. 4A to 4F. Here only a memory cell portion is shown, but another paired memory cell is similarly manufactured. While a polycrystalline silicon layer is in each case preferably used as the first and the second conductor of FIGS. 2 and 3, the first conductor may be any material that can be converted into an insulating material by a suitable method, for instance such as aluminum, and the second conductor may be anything that has a conductive property; these conductors need not necessarily be polycrystalline silicon. In FIG. 4A, first of all, an insulating film, for instance of $SiO_2$, is formed on the surface of the semiconductor substrate 24. In this insulating film, the parts corresponding to the above-mentioned transistor $Tr_2$, capacitor $Cs_2$ an impurity diffusion layer 20 constituting the data line DL1 are made thinner than the other parts of the insulating film. After this, in order to form the capacitor $Cs_2$, or the first conductor, the polycrystalline silicon layer 22 is applied by vacuum evaporation and partly removed by etching so that only the necessary parts are left. In order to make this polycrystalline silicon layer 22 conductive, an impurity is diffused into the layer after it has been applied by vacuum evaporation, or polycrystalline silicon into which an impurity is diffused previously is used. In FIG. 4B, the top surface of the above-mentioned polycrystalline silicon layer 22 is so covered with an insulating film 30 by the C.V.D. method or the like as to reduce the stray capacitance of the wiring which will subsequently be formed above this. At this time the substrate surface 31 in the region where the transistor Tr is formed and an end portion of the polycrystalline silicon layer 22 are exposed in advance. In FIG. 4C, the whole surface is oxidized by heating, so that the top surface and side end of the polycrystalline layer 22 and the surface of the substrate 24 not covered by the above-mentioned insulating film are converted to thin insulating films 32, 33 and thus the whole surface of the substrate is covered with insulating film.

Figure 4D:
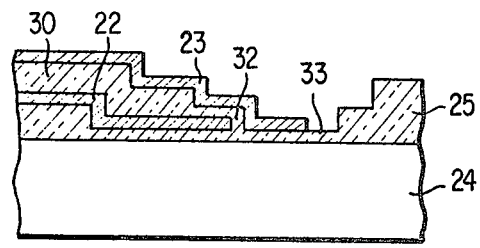
Figure 4E:
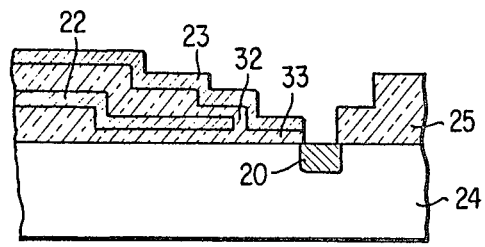
Figure 4F:
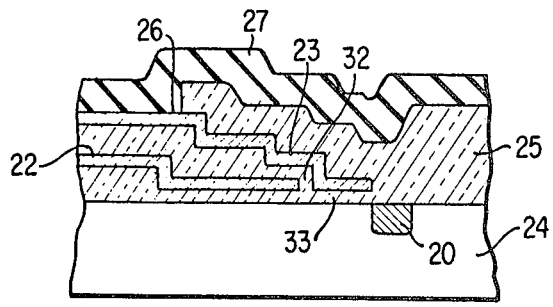

In FIG. 4D, the second conductor or the polycrystalline silicon layer 23 is formed by vacuum evaporation and then partly removed by etching; the gate electrode portion of the MOS type transistor $Tr_2$ and the wiring part for connecting this to the address line AL1 are left. Further, this polysilicon layer does not cover a portion of the insulating film 33, where a diffusion layer is formed. In FIG. 4E, with the above-mentioned polycrystalline silicon layer 23 as a mask, the thin insulating film 33 is removed and an impurity of the opposite conductivity type to that of the substrate 24 is diffused from the exposed surface of the substrate 24. The impurity diffusion layer 20 thus formed is the data line DL1 and is also one electrode of the MOS transistor Tr$_2$. When this impurity is being diffused, the impurity is introduced into the surface of the above-mentioned polycrystalline silicon layer 23, whereby the conductivity of this second conductor is increased. In FIG. 4F, an insulating film is grown over the whole surface by the C.V.D. method or the like; a contact hole 26 extending to the polycrystalline silicon layer 23 is made in this insulating film; and wiring consisting of a metal, for instance aluminium, is formed so as to make the address line AL1; and the memory cell is then complete.

As is clear from the above description, the capacitor Cs and the transistor Tr, respectively, are formed in correspondence with different polycrystalline silicon layers 22 and 23, and between these layers there is the insulating film (if the thickness of this is about 1000 Å, this is sufficient) formed from the first polycrystalline silicon layer 22 by conversion, and the layers are separated by this film, and therefore the space of about 5μ which was necessary for separation in the known arrangement, becomes unnecessary. Thus, waste of space within the memory cells on the semiconductor substrate is eliminated, whereby the area occupied by a single memory cell is reduced and the degree of integration is at once increased immensely.

Figure 5:
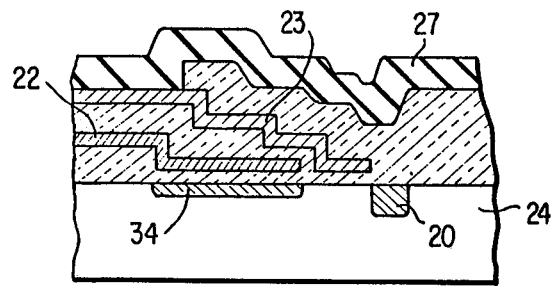
FIG. 5 is a sectional view showing another embodiment according to this invention.

Now, referring to FIG. 5, another embodiment according to this invention is illustrated. A shallow impurity diffusion layer 34 of the opposite conductivity type to the substrate 24 is formed, for instance by the ion implantation method or the like, in the surface of the substrate 24 corresponding to the capacitor Cs of which the polycrystalline layer 22 forms a part. Because of this impurity diffusion layer 34, the voltage applied to the above-mentioned polycrystalline silicon layer 22 need not be the maximum voltage.

Figure 6:
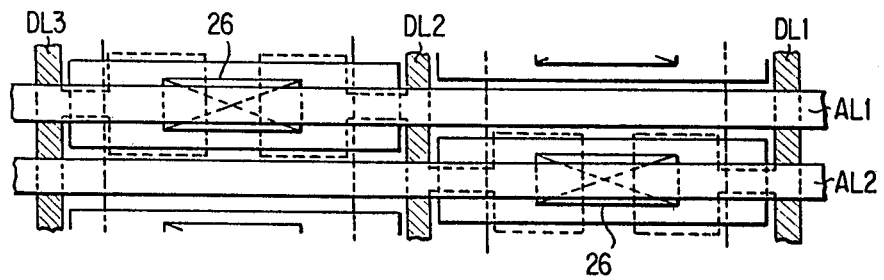
FIGS. 6 and 7 are circuit pattern layouts showing dynamic RAM arrays according to this invention.
Figure 7:
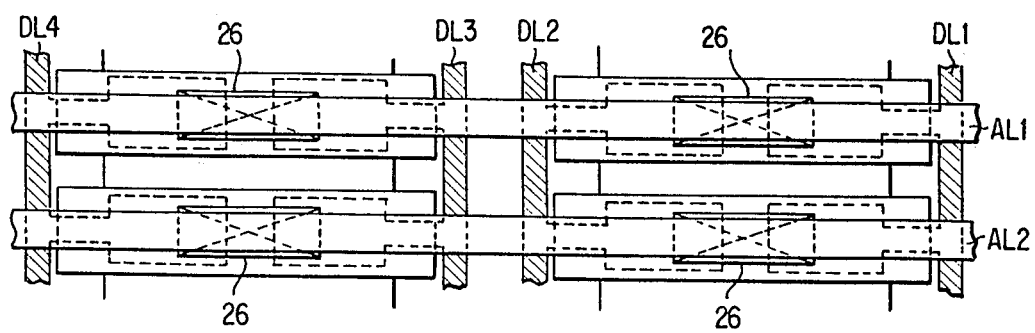

FIG. 6 and FIG. 7 are plan views in which the positional relationships of memory cells as shown in FIG. 1 are shown together with three data lines DL1, DL2, DL3 and two address lines AL1, AL2. We are considering the case in which the data lines DL consist of impurity diffusion layers in the substrate and the address lines AL are formed as metal wiring in the topmost layer, but of course a system in which the data lines are metal wiring and the address lines are formed by polycrystalline silicon layers is also possible. Now, it is a matter of common knowledge that in the case of memory cells the figure of merit is generally better in a system in which diffusion layers are used as data lines and metal wiring is used as address lines, and the present description also will be confined to this. In the case of FIG. 6, in which memory cells are disposed on both sides of the data lines DL1 and DL2, two memory cells are formed side by side between the data lines DL1 and DL2 formed parallel to one another and a respective one of these cells is connected to each of these lines, and address lines AL1 and AL2 crossing the data lines DL1 and DL2 and at right angles to the data lines are formed above these two memory cells. By this means, since the gate electrodes of the transistors of the two memory cells are formed from a common second polycrystalline silicon layer, electrical connection of an address line to two memory cells can be made by way of a single contact hole 26. in FIG. 7, memory cells are disposed on only one side of each of the data lines DL1 and DL2, DL3, and DL4 and these sides face one another. In this case also, the address lines AL1 and AL2 cross the data lines DL1, DL2, DL3 and DL4 and are at right angles to these lines, and each pair of memory cells are connected to an address line by way of one contact hole 26. In this way, as shown in the above embodiments it is clear that even if the same number of cells are formed on the semiconductor substrate the number of contact holes can be reduced to half the number required in the case of the known memory cell.

Moreover, according to this invention, the contact of the address line and the gate electrode is made above an electrode of the capacitor whose area is larger than the gate electrode. Therefore contact holes can be so made that their sizes are several times greater than in the case of the known memory cells without enlarging the chip size. This makes a greater improvement in the manufacturing yield possible because the contact holes do not have to be made minute even when the degree of integration is made higher.

As described above, when this invention is used the areas of the memory cells of a 1 transistor/cell system semiconductor memory device can be reduced, and therefore it becomes possible to store more information in the same chip area, and an improvement in the yield can also be attained, and this can therefore contribute both to improving the performance of a RAM and to lowering its cost.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for manufacturing a dynamic random access memory using a plurality of MOS FETS, wherein the MOS FETS are formed on a semiconductor substrate having a first conductivity type, comprising:

diffusing at least one pair of data line layers having a second conductivity type opposite to said first conductivity type into said substrate;

forming a pair of co-linear adjacent memory cells between the data line layers, wherein said memory cells are formed by, forming a first insulating film having a pair of thin co-linear end portions separated by a thick portion on said substrate betweeen said data line layers, forming a first conductor on said first insulating layer and bridging said first insulating layer such that said first conductor has co-linear end portions lying on said thin portions of said first insulating layer, each of said end portions of said first conductor serving as one electrode of a capacitor, forming a second insulating film on said first conductor and bridging said first conductor, said second insulating film having co-linear thin portions formed on said end portions of said first conductor;

forming a second conductor on said first and said second insulating films bridging said insulated first conductor, said second conductor having co-linear end portions disposed on the thin portions of said first insulating film and serving as the gate electrodes of said pair of adjacent memory cells, said second conductor having a central portion bridging said first conductor and insulated therefrom by said second insulating film, forming an address line above said memory cells, locating a single contact hole in said address line to said central portion of said second conductor between the co-linear adjacent memory cells, and connecting said address line to said central portion of said second electrode through said contact hole.

2. A method for manufacturing a dynamic Random Access Memory according to claim 1 wherein step (b) comprises forming a polycrystalline silicon layer having an end portion lying on a portion of the first insulating film to serve as one electrode of a capacitor.

3. A method for manufacturing a dynamic Random Access Memory according to claim 1 wherein step (c) comprises converting the end portion of the first conductor to a second thin insulating film having a thickness less than 1000 Å.

* * * * *